United States Patent
Fujimoto et al.

[11] Patent Number: 5,986,309
[45] Date of Patent: Nov. 16, 1999

[54] SEMICONDUCTOR INTEGRATED CIRCUIT APPARATUS HAVING A PLURALITY OF WELL BIAS VOLTAGE SUPPLY CIRCUITS

[75] Inventors: Yukihiro Fujimoto, Yokohama; Kazutaka Nogami, Tokyo, both of Japan

[73] Assignee: Kabushiki Kaisha Toshiba, Kawasaki, Japan

[21] Appl. No.: 08/178,365

[22] Filed: Jan. 6, 1994

Related U.S. Application Data

[63] Continuation of application No. 07/888,027, May 26, 1992, abandoned.

[30] Foreign Application Priority Data

May 30, 1991 [JP] Japan .................................... 3-127814

[51] Int. Cl.⁶ ........................... H01L 29/76; H01L 29/94; H01L 31/113; H01L 31/119
[52] U.S. Cl. ........................... 257/368; 257/369; 257/296
[58] Field of Search .................................. 257/368, 379, 257/393, 369, 296

[56] References Cited

U.S. PATENT DOCUMENTS

| | | |
|---|---|---|
| 4,327,404 | 4/1982 | Horiguchi . |
| 4,748,487 | 5/1988 | Uchida et al. .......................... 257/379 |
| 4,937,647 | 6/1990 | Sutton ..................................... 257/379 |
| 4,949,137 | 8/1990 | Matsuzaki et al. ..................... 257/379 |
| 4,951,111 | 8/1990 | Yamamoto .............................. 257/368 |
| 5,055,905 | 10/1991 | Anmo ..................................... 257/379 |
| 5,101,258 | 3/1992 | Moriuchi et al. ....................... 257/368 |
| 5,177,586 | 1/1993 | Ishimura et al. ....................... 257/368 |
| 5,293,055 | 3/1994 | Hara et al. . |
| 5,726,475 | 3/1998 | Sawada et al. . |

*Primary Examiner*—Stephen D. Meier
*Attorney, Agent, or Firm*—Finnegan, Henderson, Farabow, Garrett & Dunner, L.L.P.

[57] ABSTRACT

A semiconductor integrated circuit apparatus comprises a semiconductor substrate, a first well region formed in the upper surface of the semiconductor substrate, a first circuit formed in the first well region, first bias voltage supply functions for supplying a bias voltage to the first well region, a second well region formed in the upper surface of the semiconductor substrate such that it does not contact the first well region, a second circuit formed in the second well region, and second bias voltage supply functions for supplying a bias voltage to the second well region.

10 Claims, 6 Drawing Sheets

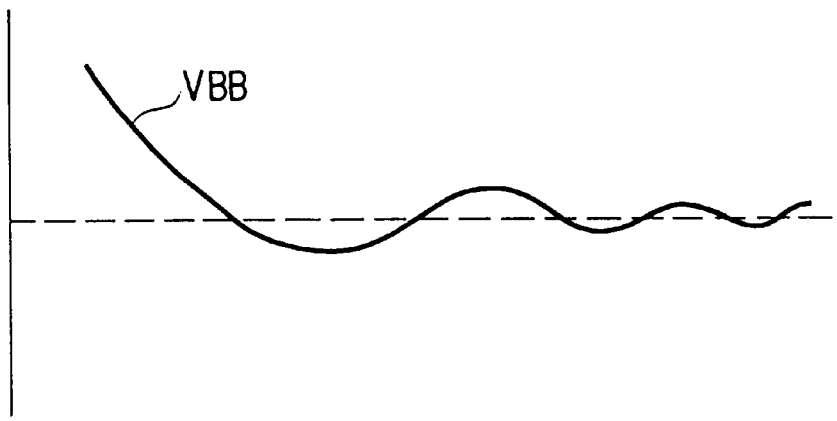
F I G. 3
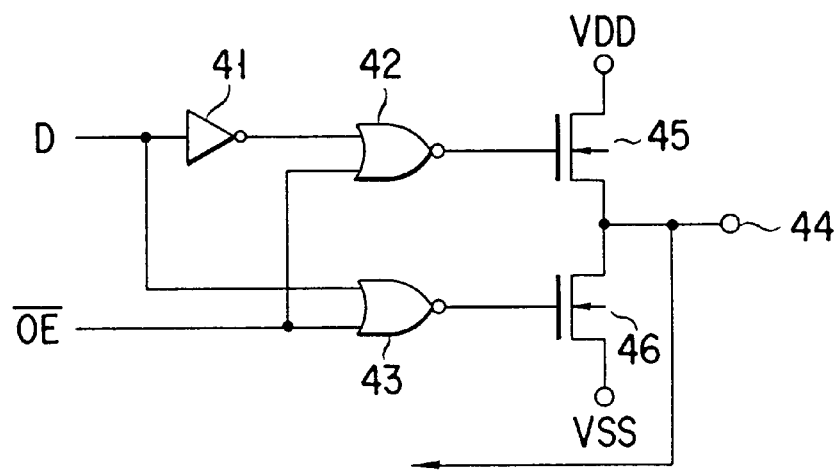
F I G. 4

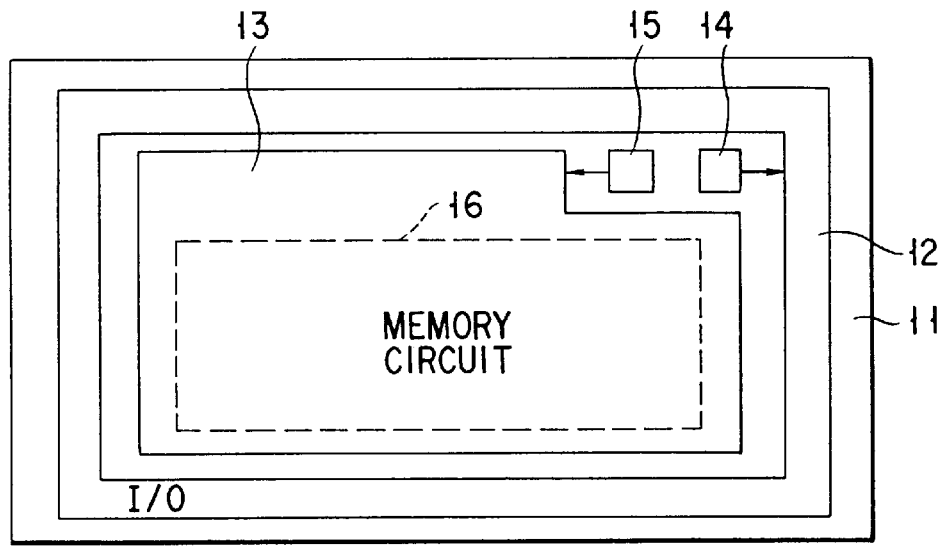
F I G. 5
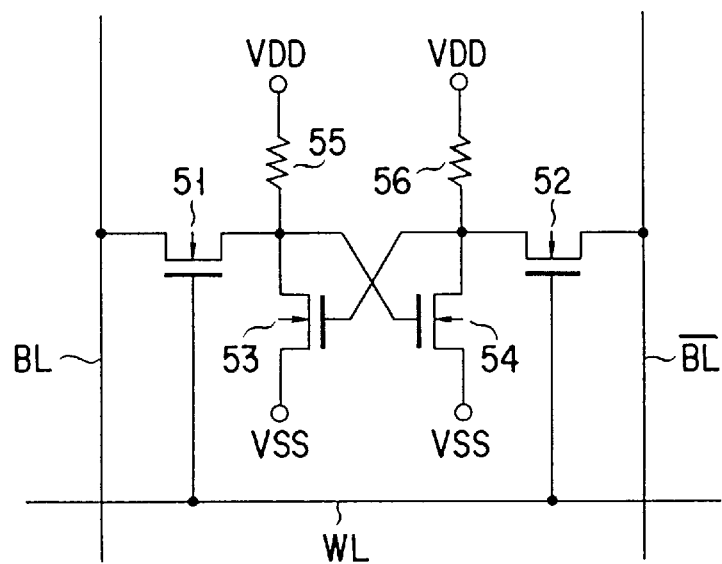
F I G. 6

5,986,309

SEMICONDUCTOR INTEGRATED CIRCUIT APPARATUS HAVING A PLURALITY OF WELL BIAS VOLTAGE SUPPLY CIRCUITS

This application is a continuation of application Ser. No. 07/888,027, filed May 26, 1992, now abandoned.

BACKGROUND OF THE INVENTION

1. Field of the Invention

This invention relates to a MOS type semiconductor integrated circuit apparatus having a well bias voltage supply circuit, and in particular to an apparatus of this type having a plurality of well bias voltage supply circuits for supplying different well bias voltages.

2. Description of the Related Art

In general, a MOS type semiconductor integrated circuit apparatus has a well region formed therein and is provided with various elements such as a MOS transistor. A well bias voltage of a predetermined value is supplied to the well region so as to stabilize the threshold voltage of the MOS transistor formed therein.

In the MOS type semiconductor integrated circuit apparatus, however, if the well potential of part of a circuit incorporated in the apparatus is incidentally changed during operation thereof, the change may adversely affect the overall circuit, causing the circuit to be unstable. This will hereinbelow be explained in detail.

FIG. 11 shows the waveform of an output generated from an output circuit incorporated in the MOS type semiconductor integrated circuit apparatus. As shown in the figure, where an output data D is changed from "H" level to "L" level, undershoot is caused in the output potential Vout. $V_{BB}$ denotes a well bias voltage, which is set to −2.0V. The well bias voltage slightly fluctuates as indicated by A where undershoot is caused in the output voltage Vout, which adversely affects operation of an element such as a memory device.

FIG. 8 is a cross sectional view, showing the elements of an output transistor incorporated in the output circuit. In FIG. 8, reference numeral 81 denotes an n-type semiconductor substrate, reference numeral 82 denotes a p-type well region, reference numerals 83 and 84 denote an n-type diffusion region for forming the drain and source regions of the output transistor, and reference numeral 85 denotes a gate electrode. If the output voltage Vout (the drain potential of the output transistor) becomes lower than the well potential, a pn junction consisting of an n-type diffusion region 83 as the drain region and a p-type well region 82 is forwardly biased. Thus, current flows toward the n-type diffusion region 83 and p-type well region 82, causing a change in well potential.

In the above integrated circuit apparatus, the well regions of circuits are electrically connected to one another, so that a change in the well potential of an input/output circuit adversely affects the well potential of each of circuits other than the input/output circuit, causing circuit operation to be unstable. Therefore, a malfunction may occur in a logic circuit, and data in the logic circuit may disappear in a memory circuit. In particular, operation of a SRAM (Static Random Access Memory) circuit incorporating an E/R type memory cell consisting of a high resistance serving as load element is more liable to become unstable since it is inherently difficult to keep the circuit stable.

Moreover, in a MOS type semiconductor integrated circuit apparatus having a logic circuit and a memory circuit, the logic circuit must incorporate a MOS transistor of a low threshold voltage so as to achieve high speed operation, and the memory circuit must incorporate a MOS transistor of a high threshold voltage so as to stabilize the operation of the circuit. Actually, however, the well potential of the logic circuit cannot be set independent of that of the memory circuit, that is, one of the circuits cannot have an appropriate threshold voltage.

SUMMARY OF THE INVENTION

It is the object of the invention to provide a MOS type semiconductor integrated circuit apparatus capable of being operated in a stable manner even when the well potential of one of circuits incorporated in the apparatus becomes unstable, and to provide a MOS type semiconductor integrated circuit apparatus incorporating circuits each having an appropriate well potential.

To attain the above object, the semiconductor integrated circuit of the invention comprises a semiconductor substrate; a first well region formed in the upper surface of the semiconductor substrate; a first circuit formed in the first well region; first bias voltage supply means for supplying a bias voltage to the first well region; a second well region formed in the upper surface of the semiconductor substrate such that it does not contact the first well region; a second circuit formed in the second well region; and second bias voltage supply means for supplying a bias voltage to the second well region.

Since the bias voltage supply means of the well regions are electrically independent of each other, the second bias voltage supply means can supply a predetermined voltage to the second well region in the second circuit even when the bias voltage from the first bias voltage supply means fluctuates at the time of operating the first circuit. Further, since the two bias voltage supply means are provided independent of each other, they can supply optimal voltages to the respective well regions. Accordingly, each circuit can be operated optimally.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a graph, showing the waveform of an output generated from the well bias voltage supply circuit of FIG. 2;

FIG. 4 is a circuit diagram, showing part of an input/output circuit employed in the circuit of the first embodiment;

FIG. 5 is a block diagram, showing a second embodiment of the invention;

FIG. 6 is a circuit diagram, showing an E/R type memory cell incorporated in the second embodiment;

DETAILED DESCRIPTION OF THE PREFERRED EMBODIMENTS

Embodiments of the invention will now be explained with reference to the accompanying drawings.

Figure 1:
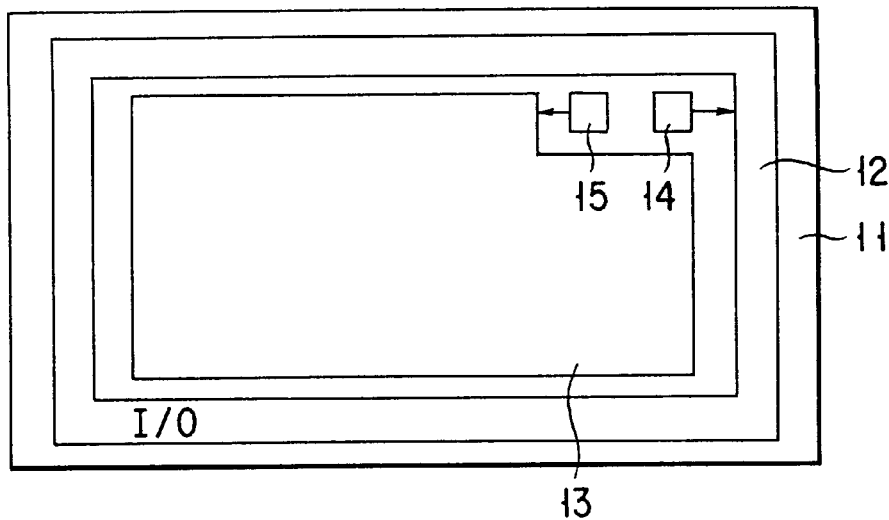
FIG. 1 is a block diagram, showing a MOS type semiconductor integrated circuit apparatus according to a first embodiment of the invention.

FIG. 1 shows a MOS type semiconductor integrated circuit apparatus according to a first embodiment of the invention. The integrated circuit apparatus denoted by reference numeral 11 has well regions 12 and 13. The well region 12 has an input/output circuit formed therein for transmitting signals between the apparatus 11 and a device provided outside the apparatus 11. The well region 13 has a circuit other than the input/output circuit.

The integrated circuit apparatus 11 further has well bias voltage supply circuits 14 and 15. The circuits 14 and 15 apply well bias voltages of a predetermined value to the well regions 12 and 13, respectively.

The well region 12 in which the input/output circuit is formed is electrically isolated from the well region 13, and has a well potential differing from that of the region 13. Accordingly, the input/output potential of the input/output circuit is lower than the well potential of the well region 12, and hence if the well potential of the well region 12 fluctuates, the fluctuation will not affect the well potential of the well region 13. As a result, the well potential of the well region 13 is always kept stable, thereby stabilizing the operations of the circuits formed in the well region 13.

A logic circuit, a memory circuit, an analog amplifier, etc., are formed in the well region 13 in accordance with the design of the apparatus.

Figure 2:
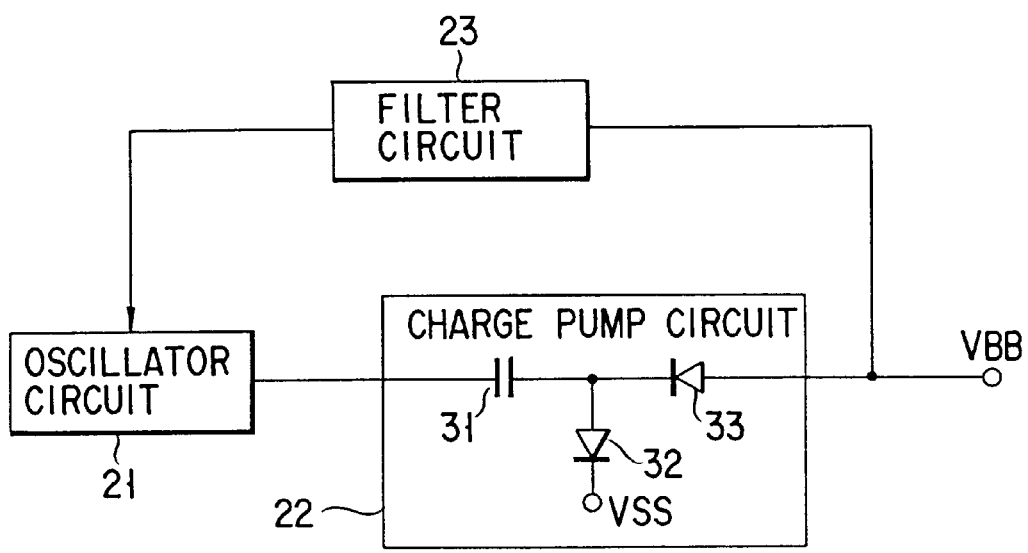
FIG. 2 is a block diagram, showing a well bias voltage supply circuit incorporated in the apparatus of FIG. 1.

FIG. 2 shows the well bias voltage supply circuits 14 and 15. In the embodiment, the well regions 12 and 13 are p-type semiconductor regions, and the well bias voltage supply circuits 14 and 15 generate negative voltages. The well bias voltage supply circuits have structures similar to each other—each comprises, for example, an oscillator circuit 21 for setting oscillation frequency in accordance with the value of the control voltage, a charge pump circuit 22 for generating a well bias voltage $V_{BB}$ of a negative value contained in the output of the oscillation circuit 22, and a filter circuit 23 for returning the bias voltage $V_{BB}$, serving as control voltage, to the oscillation circuit 21.

The charge pump circuit 22 includes a capacitor 31 for interrupting direct current, a diode 32 for allowing the positive component of alternate current, having passed the capacitor 31, to leak into a power source of a reference potential VSS, and a diode 33 for passing therethrough the negative component of the alternate current having passed the capacitor 31.

In the above-described well bias voltage supply circuit, when a predetermined period of time elapses after the oscillation circuit 21 starts to oscillate, a closed loop formed by the charge pump circuit 22 and filter circuit 23 gradually converges the well bias voltage $V_{BB}$ to a predetermined value as shown in FIG. 3.

FIG. 4 shows that part of the input/output circuit formed in the well region 12 incorporated in the first embodiment which is necessary for generating a one-bit input/output signal. The output data D produced by the integrated circuit is supplied to an inverter 41 and to one input terminal of a two-input NOR circuit 42. The output of the inverter 41 is supplied to one input terminal of a two-input NOR circuit 42. An output enabling signal /EN is supplied to the other input terminal of each of the NOR circuits 42 and 43.

The source and drain of an n-type output MOS transistor 45 are interposed between the high potential power source VDD and an input/output terminal 44. The gate of the transistor 45 is supplied with the output of the NOR circuit 42. The source and drain of an n-type output MOS transistor 46 are interposed between the reference potential power source VSS and the input/output terminal 44. The gate of the transistor 46 is supplied with the output of the NOR circuit 43. The input/output terminal 44 is supplied with a signal from the outside.

The circuit constructed as above operates as output circuit when the output enabling signal /EN is "L". Specifically, when the signal /EN is "L", the NOR circuits 42 and 43 serve as inverters. In this state, when the data D is "L", the output of the NOR circuit 42 is "L", and the output of the NOR circuit 43 is "H", thereby causing the MOS transistor 45 to be off and the MOS transistor 46 to be on, and outputting an "L" signal from the input/output terminal 44. When the data D is "H", the output of the NOR circuit 42 is "H", and the output of the NOR circuit 43 is "L", thereby causing the MOS transistor 45 to be on and the MOS transistor 46 to be off, and outputting an "H" signal from the input/output terminal 44.

On the other hand, when the output enabling signal /EN is "H", the outputs of the NOR circuits 42 and 43 are both "L", causing the MOS transistors 45 and 46 to be off, and the input/output terminal 44 to be in a high impedance state. Accordingly, the input/output terminal 44 can receive a signal from the outside, and the circuit of FIG. 4 can operate as input circuit.

FIG. 5 shows a second embodiment of the invention. The integrated circuit apparatus 11 employed in this embodiment has two well regions 12 and 13 as in the first embodiment. The well region 12 has an input/output circuit formed therein, while the well region 13 has circuits formed therein and including a memory circuit 16 provided with a plurality of E/R type memory cells. The well regions 12 and 13 are supplied with well bias voltages generated by well bias voltage supply circuits 14 and 15, respectively.

FIG. 6 shows the structure of the E/R type memory cell. In this figure, reference numerals 51 and 52 denote transfer gates each consisting of an n-type MOS transistor. One end of the transfer gate 51 is connected to a bit line BL, and one end of the transfer gate 52 is connected to a bit line $\overline{BL}$, and the gates of the transfer gates are connected to a word line WL. The other end of the transfer gate 51 is connected to the drain of an n-channel MOS transistor 53, to the gate of an n-channel MOS transistor 54, and to one end of a resistor element 55. The other end of the transfer gate 52 is connected to the gate of the transistor 53, to the drain of the transistor 54, and to one end of a resistor 56. The sources of the transistors 53 and 54 are connected to the reference potential power source VSS, and the other end of each of the resistors 55 and 56 is connected to the high potential power source VDD.

The above memory cell is a flip flop consisting of two inverters having the resistors 55 and 56 serving as load elements and the n-channel MOS transistors serving as driving elements, and can store 1-bit data. Data is written into and read out of the memory cell via the transfer gates 51 and 52, and the bit lines BL and $\overline{BL}$.

In the memory cell constructed as above, fine elements are incorporated and the resistor elements 55 and 56 have a high resistance, so that the amount of electric charge accumulated in parasitic regions existing in the drain regions of the MOS transistors 53 and 54 is small. Thus, as described above, when the well potential of the well region 13, in which the memory cell is formed, slightly fluctuates, and accordingly the threshold voltages of the transistors 53 and 54 are slightly varied, that one of the MOS transistors which should be kept off may be turned on, thereby destroying stored data.

However, in the second embodiment, the well region 13 provided with the memory circuit 16 having a plurality of E/R type memory cells is electrically isolated from the well region 12 provided with the input/output circuit, and the well regions 12 and 13 are supplied with well bias voltages independently. Accordingly, even if the input/output voltage becomes lower than the well potential of the well region 12, thereby fluctuating the well potential of the input/output circuit, the well bias potential of the memory circuit is kept at a predetermined value, and therefore destruction of data can be prevented.

Figure 7:
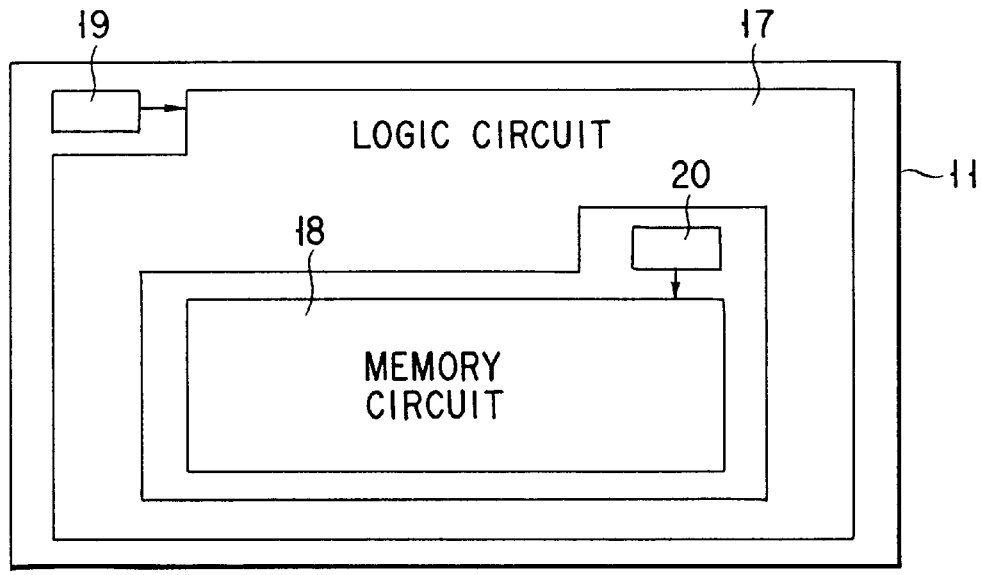
FIG. 7 is a block diagram, showing a third embodiment of the invention.
Figure 8:
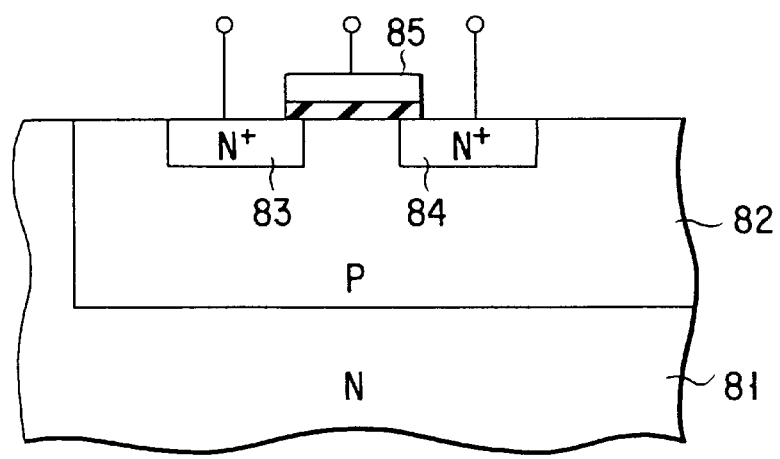
FIG. 8 is a cross sectional view of an output transistor employed in an output circuit of the MOS type semiconductor integrated circuit apparatus.

FIG. 7 shows a third embodiment of the invention. Also in the integrated circuit apparatus of this embodiment, two well regions 17 and 18 are formed. A logic circuit having a plurality of MOS transistors is formed in the well region 17, while a memory circuit having a plurality of memory cells each consisting of a MOS transistor is formed in the well region 18. Further, the apparatus 11 is also provided with two well bias voltage supply circuits 19 and 20 as shown in FIG. 2. The circuits 19 and 20 supply different well voltages to the well regions 17 and 18, respectively.

In the third embodiment, the well regions 17 and 18 are electrically isolated from each other, and the well bias voltage supply circuits 19 and 20 are provided for independently supplying well bias voltages to the well regions, so that the threshold voltages of the MOS transistors formed in the well regions 17 and 18 can be set independently. For example, on the side of the logic circuit the well potential is set to −1.0V to make low the threshold voltage of each MOS transistor, so as to achieve high speed operation. On the side of the memory circuit, the well potential is set to −2.0V to make high the threshold voltage of the MOS transistor forming each memory cell, so as to stabilize the operation of the memory cell. Thus, high-speed operation of the logic circuit and stable operation of each memory cell in the memory circuit can be achieved.

Figure 9:
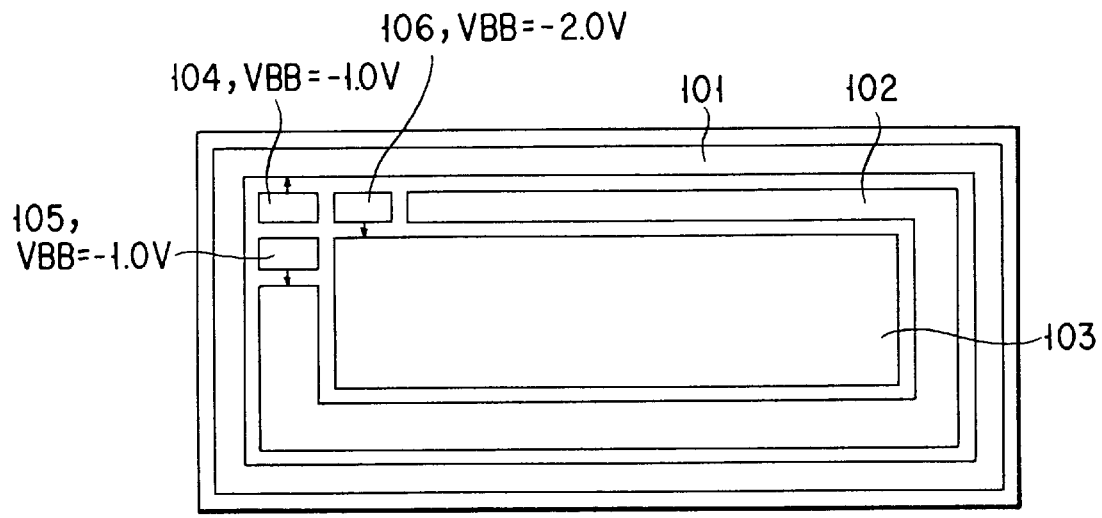
FIG. 9 is a block diagram, showing a fourth embodiment of the invention.

FIG. 9 shows a fourth embodiment of the invention. The MOS type semiconductor integrated circuit apparatus is a semiconductor memory apparatus, and comprises an input/output circuit block 101, a logic circuit block 102, and a memory circuit block 103 which are formed on independent well regions, respectively. The well regions are supplied with bias voltages from a bias voltage supply circuit 104 ($V_{BB}$=−1.0V) dedicated to the input/output circuit, a bias voltage supply circuit 105 ($V_{BB}$=−1.0V) dedicated to the logic circuit, and a bias voltage supply circuit 106 ($V_{BB}$=−2.0V) dedicated to the memory circuit, respectively. At this time, the threshold voltage of the memory circuit is increased by relatively reducing its bias voltage $V_{BB}$ so as to avoid erroneous operation thereof, while the threshold voltages of the other circuits are reduced by relatively increasing their bias voltages $V_{BB}$, which are relatively low, so as to speed up their operations.

Figure 11:
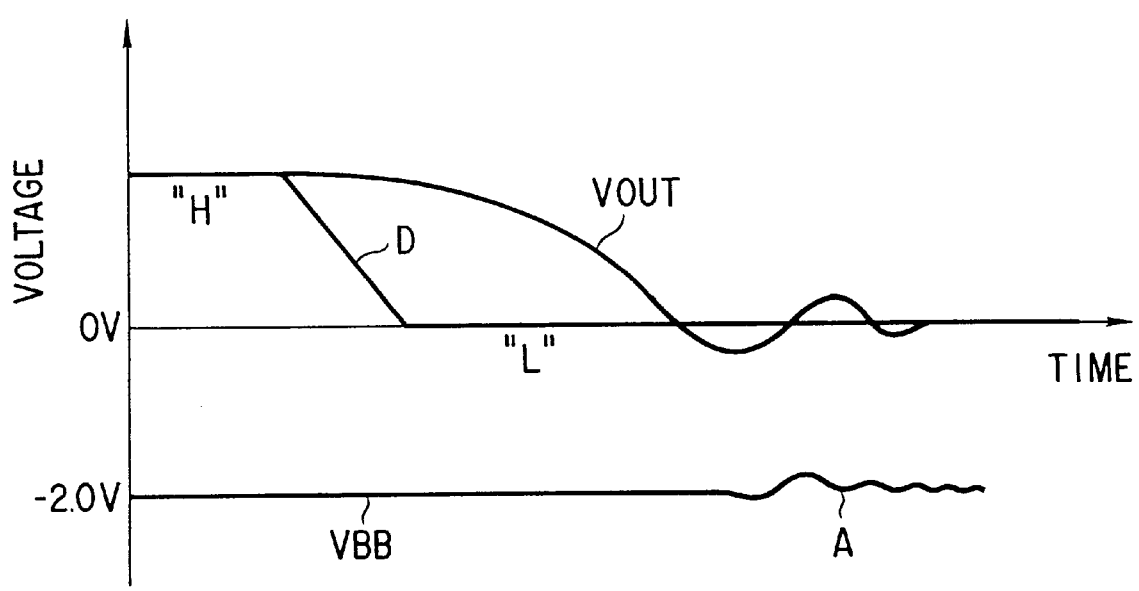
FIG. 11 is a graph, showing the waveform of an output generated from an output circuit employed in a conventional MOS type semiconductor integrated circuit apparatus.

By virtue of the above structure, even if the well potential of the input/output circuit 101 is varied rollingly as indicated by A in FIG. 11, it will not affect the well potentials of the logic and memory circuits 102 and 103, whereby predetermined operations can be performed in a reliable manner.

Figure 10:
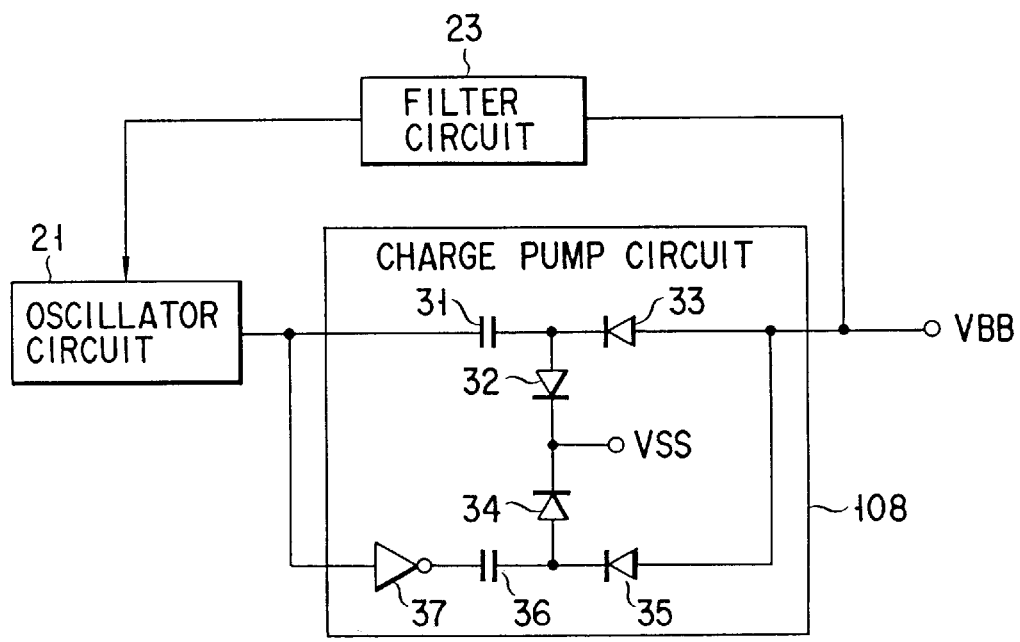
FIG. 10 is a block diagram, showing a well bias voltage supply circuit employed in the fourth embodiment.

FIG. 10 shows the well bias voltage supply circuit 104 incorporated in the fourth embodiment and dedicated to the input/output circuit 101. The circuit 104 is similar to that shown in FIG. 2. However, since the well potential of the circuit 104 is varied greatly during operation thereof, it comprises a two-stage charge pump circuit 108 including diodes 34 and 35, a capacitor 36, and an inverter 37, in addition to other elements shown in FIG. 2. The circuit 108 enables the well potential of the input/output circuit 101 to be stable.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A MOS semiconductor integrated circuit apparatus comprising:
   a semiconductor substrate;
   a first well region formed in the upper surface of the semiconductor substrate;
   a first MOS semiconductor circuit including MOSFET formed in the first well region;
   first bias voltage supply means for supplying a bias voltage to the first well region;
   a second well region formed in the upper surface of the semiconductor substrate such that it does not contact the first well region;
   a second MOS semiconductor circuit including MOSFET formed in the second well region; and
   second bias voltage supply means for supplying a bias voltage to the second well region,
   wherein at least one of the first and second bias voltage supply means includes capacitors, diodes, and an inverter, for reducing variations in the bias voltage.

2. A semiconductor integrated circuit apparatus according to claim 1, wherein the first circuit includes an interface circuit for inputting and outputting data to and from the apparatus.

3. A semiconductor integrated circuit apparatus according to claim 2, wherein the second circuit includes a data memorizing circuit, and the apparatus is a data memorizing apparatus.

4. A semiconductor integrated circuit apparatus according to claim 2, wherein the second circuit includes a logic circuit.

5. A semiconductor integrated circuit apparatus according to claim 2, wherein the second circuit includes an analog circuit.

6. A semiconductor integrated circuit apparatus according to claim 2, wherein the first and second well regions are p-type well regions, and the first and second bias voltage supply means generate and supply negative voltages.

7. A semiconductor integrated circuit apparatus according to claim 3, wherein the second bias voltage supply means supplies a voltage lower than the first bias voltage supply means.

8. A semiconductor integrated circuit apparatus according to claim 1, further comprising:

a third well region formed in the upper surface of the semiconductor substrate such that it does not contact the first and second well regions;

a third circuit formed in the third well region; and third bias voltage supply means for supplying a bias voltage to the third well region.

9. A semiconductor integrated circuit apparatus according to claim 8, wherein the third bias voltage supply means includes a plurality of means, consisting of capacitors, diodes, and an inverter, for reducing variations in the bias voltage.

10. A MOS semiconductor integrated circuit apparatus comprising:

a semiconductor substrate;

a first well region formed in the upper surface of the semiconductor substrate;

a first MOS semiconductor circuit including MOSFET formed in the first well region and including a circuit for inputting and outputting data to and from the apparatus;

first bias voltage supply means for supplying a bias voltage to the first well region;

a second well region formed in the upper surface of the semiconductor substrate such that it does not contact the first well region;

a second MOS semiconductor circuit including MOSFET formed in the second well region and including a data memorizing circuit;

second bias voltage supply means for supplying the second well region with a bias voltage lower than that of the first bias voltage supply means;

a third well region formed in the upper surface of the semiconductor substrate such that it does not contact the first and second well regions;

a third MOS semiconductor circuit including MOSFET formed in the third well region; and third bias voltage supply means for supplying the third well region with a bias voltage substantially equal to that of the first bias voltage supply means, wherein at least one of the first, second and third bias voltage supply means includes capacitors, diodes, and an inverter, for reducing variations in the bias voltage.

* * * * *